(12) United States Patent
Kirihata et al.

(10) Patent No.: US 6,262,615 B1
(45) Date of Patent: Jul. 17, 2001

(54) DYNAMIC LOGIC CIRCUIT

(75) Inventors: Toshiaki Kirihata, Poughkeepsie; Gerd Frankowsky, Wappingers Falls, both of NY (US)

(73) Assignees: Infineon Technologies AG, Munich (DE); International Business Machines, Armonk, NY (US)

( * ) Notice: Subject to any disclaimer, the term of this patent is extended or adjusted under 35 U.S.C. 154(b) by 0 days.

(21) Appl. No.: 09/257,304

(22) Filed: Feb. 25, 1999

(51) Int. Cl.$^7$ .................................................... H03K 3/037
(52) U.S. Cl. ............................................ 327/200; 327/201
(58) Field of Search .................................. 327/199–203, 327/208–212, 213, 218; 326/95–98; 377/74, 79

(56) References Cited

U.S. PATENT DOCUMENTS

| | | | |
|---|---|---|---|
| 4,138,613 | * | 2/1979 | Tanaka ..................................... 326/96 |
| 5,329,176 | | 7/1994 | Miller, Jr. et al. ..................... 307/443 |
| 5,453,708 | | 9/1995 | Gupta et al. ............................ 326/98 |
| 5,623,450 | | 4/1997 | Phillips et al. ........................ 365/203 |
| 5,706,237 | | 1/1998 | Ciraula et al. ........................ 365/222 |
| 5,757,205 | * | 5/1998 | Ciraula et al. ........................ 326/21 |
| 5,867,049 | * | 2/1999 | Mohd ..................................... 327/200 |
| 5,892,385 | * | 4/1999 | Hashiguchi ........................... 327/333 |
| 5,900,752 | * | 5/1999 | Mar ....................................... 327/143 |
| 6,011,410 | * | 1/2000 | Kim et al. ............................... 326/98 |
| 6,060,910 | * | 5/2000 | Inui ........................................ 326/98 |

FOREIGN PATENT DOCUMENTS

| | | |
|---|---|---|
| 0 820 147 | 1/1998 | (EP) . |
| 0 855 801 | 7/1998 | (EP) . |
| 0 863 614 | 9/1998 | (EP) . |
| 10-188556 | 12/1996 | (JP) . |

* cited by examiner

*Primary Examiner*—Tuan T. Lam
(74) *Attorney, Agent, or Firm*—Stanton C. Braden

(57) ABSTRACT

A dynamic logic circuit having a charging circuit, comprising a first transistor having a first source/drain electrode adapted for coupling to a voltage supply and a second source/drain electrode connected to a node. The charging circuit couples the voltage supply to the node to place an initial charge on the node. A data transfer circuit is provided comprising a second transistor having a gate adapted for coupling to an input strobe pulse, a first source/drain electrode connected to the node, and a second source/drain electrode responsive to an input data and the input strobe pulse, for transferring the input data to the node to the node such that the pre-charged node is either discharged or remains depending on the input data. An output circuit is responsive to an output strobe pulse for coupling the data at the node to an output. A trailing edge detector of the output strobe pulse detects a time at which the coupling of the data to the output is complete and pre-charges the node at a high level for a subsequent input strobe pulse.

23 Claims, 4 Drawing Sheets

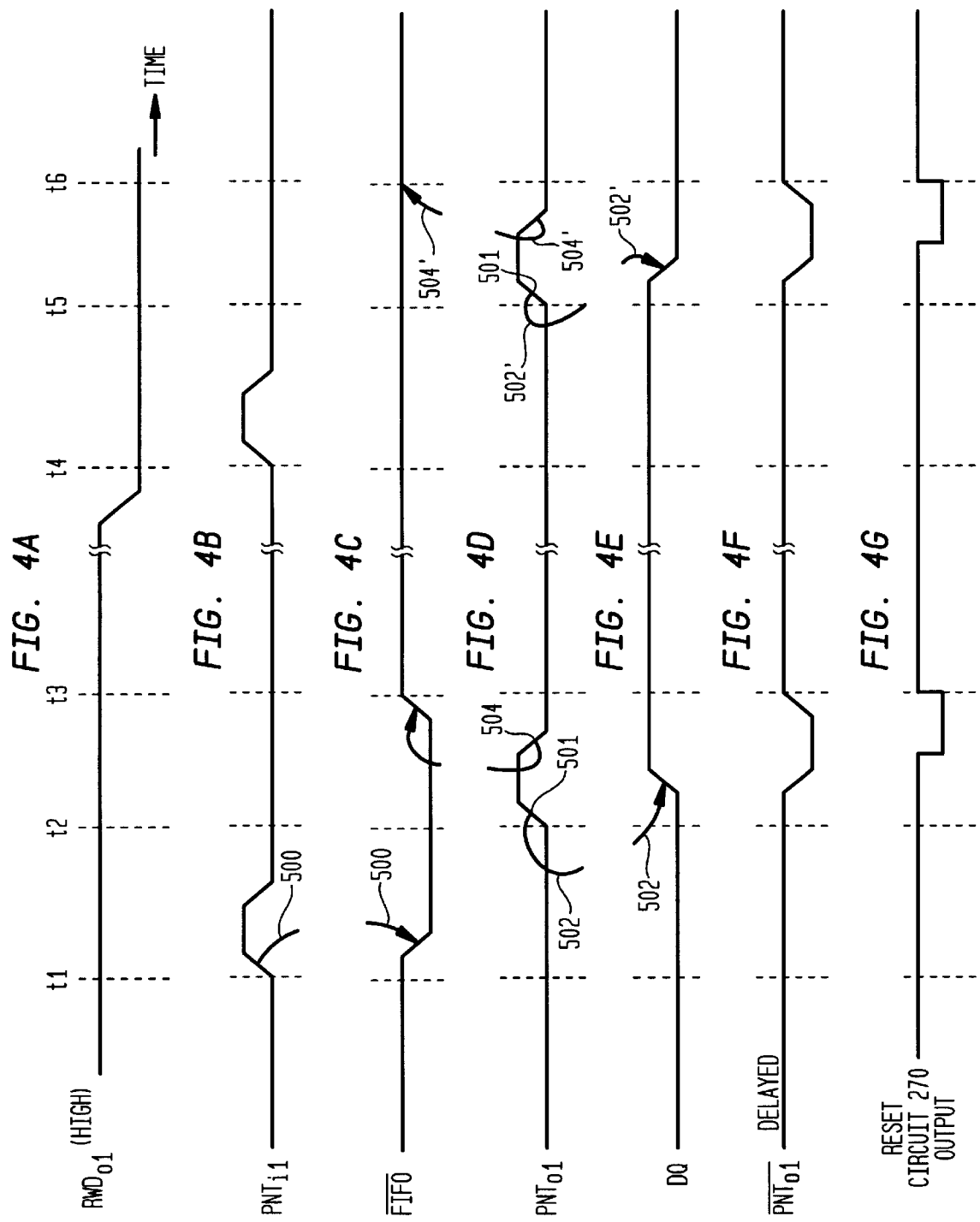

DYNAMIC LOGIC CIRCUIT

BACKGROUND OF THE INVENTION

This invention relates generally to logic circuits and more particularly to dynamic logic circuits.

As is known in the art, storage of data is required in many applications. One such storage circuit is a first-in first-out (FIFO) circuit. The FIFO circuit is commonly used for varying, or controlling, the delay, or latency, between data fed to an input of the FIFO and the data read from the FIFO. This latency control is important in synchronizing stages in, for example, a pipe-line operation. FIG. 1 shows a bus architecture, or system 10 comprising a stage 0 driver 100 and a stage 1 FIFO storage section 110. The driver 100 is here a CMOS driver, here an inverter having a pair of CMOS transistors 101, 102 arranged as shown. The driver 100 is used to drive a bus RWD to the FIFO storage section 110 for data on the RWD. The data is transferred to the output line DQ after a certain latency. More particularly, transistor 101 is a p-channel MOSFET having its source connected to a +2.1 volt supply, its gate connected to a logic input signal fed to line 103, and a drain connected to the source of n-channel MOSFET 102. The gate of MOSFET 102 is also connected to line 103, the drain of MOSFET 102 being connected to a reference potential, here ground. The logic input signal fed to line 103 varies between ground (i.e., a logic 0, here "low") and +2.1 volts (i.e., a logic 1, here "high"). The transistor 102 has a threshold level, here 0.6 volts. Thus, when the logic input signal is logic 0, the output of the inverter. i.e., a read-write-drive (RWD) bus, becomes 2.1 volts and, on the other hand, when the input logic signal is logic 1, the bus RWD becomes 0 volts. It is noted that, in this example, the RWD bus is approximately 6mm long, which is resistive (approximately 200 ohms) and capacitive (approximately 5pF). The stage 1 FIFO includes a storage section 110. The storage section includes a plurality of, here 3, parallel storage units or registers, $110_1$–$110_3$, as indicated. Each one of the storage registers, $110_1$–$110_3$ is identical in construction, an exemplary one thereof, here register $110_1$, being shown in detail. Each one of the registers $110_1$ 14 $110_3$ is fed by a pair of strobe pulses on lines: PNTi1, PNTo1; PNTi2, PNTo2; and PNTi3, PNTo3, respectively, as indicated. The lines PNTi1, PNTi2, and PNTi3, are sometimes referred to as pointer input lines. The lines PNTo1, PNTo2, and PNTo3, are sometimes referred to as pointer output lines. The voltage swing of the strobe pulses PNTi1, PNTo1; PNTi2, PNTo2; and PNTi3, PNTo3 are here from 0 volts (i.e., a "low", or logic 0) to +2.1 volts (i.e., a "high" or logic 1)

Thus, considering exemplary register $110_1$, such register $110_1$, includes an input CMOS transfer, or transmission, gate 120, an output CMOS transmission gate 140, and a latch 130 coupled between the input CMOS transmission gate 120 and the output CMOS transmission gate 140, as indicated. The input CMOS transmission gate 120 includes an n-channel MOSFET 121 and a p-channel MOSFET 123 having their gates connected to the PNTi1 line; the gate of MOSFET 123 being connected to such PNTi1 line through an inverter, as indicated. The sources of MOSFET 121, 123 are connected in common to the RWD bus. The latch 130 includes a pair of inverter connected in a conventional manner, as indicated. The output CMOS transmission gate 140 includes an n-channel MOSFET 141 and a p-channel MOSFET 143 having their gates connected to the PNTo1 line; the gate of MOSFET 143 being connected to such PNTo1 line through an inverter, as indicated. The sources of MOSFET 141, 143 are connected in common to the output of the latch 130 and the drains are connected to data-output line DQ, as indicated. Thus, the output of the output CMOS transmission gate 140 appears on line DQ.

In operation, consider that the FIFO storage section 110 operates with control signal being supplied by a master clock, not shown, which produces clock pulses, CLK, shown in FIG. 2A. Next, let it be assumed that strobe pulses are supplied to PNTi1, PNTi2, PNTi3, in response to a sequence of three consecutive clock pulses CLK, as shown in FIGS. 2B, 2C and 2D, respectively. In such example, the first logic input signal on line 103 is driven by the bus CMOS driver 100 and will pass through input transmission gate 120 in response to the strobe pulse PNTi1 and will become latched into latch 130. The second logic input signal on line 103 become latched in register $110_2$ in response to the strobe pulse PNTi2. In like manner, the third logic input signal on line 103 will become latched in register 1 $103$ in response to the strobe pulse PNTi3. In order for the FIFO 10 to operate as a FIFO, the data in register 10, (i.e., the first logic input signal) must be read out on line DQ prior to the subsequent PNTi1, which allows the register $111_1$, to fetch the subsequent data on the RWD bus again. Thus, in this example, the strobe pulse on line PNTo1 must occur during the time of the strobe pulse PNTi2, as shown in FIG. 2E or during the time of the strobe pulse PNTi3, as shown in FIG. 2F. That is, in order to prevent the latched data in a register from being destroyed, the latched data must be transferred out of the register before new data is latched into the same register. Thus, each logic input signal (i.e., data) has either a one, or two, clock pulse latency in the example with three registers to prevent the data from being destroyed. Considering the more general case of a FIFO having N registers, where N is an integer greater than 1, the latency may be from 1 to (N−1) clock pulses. Thus, by varying this latency from 1 to (N−1), the synchronization for following stages, not shown, can be optimized in a pipe-line operation.

The data stored in the latch of the registers $110_1$, $110_2$, or $110_3$, is transferred to data-output when the pointer output PNTo1, PNTo2, PNTo3, respectively, opens the CMOS output transmission gate 140. The low voltage RWD signalling reduces a current of the driver 100, while improving a data rate of the signalling. This concept is increasingly important for current and future VLSI. It should be noted that this FIFO 10 requires a level conversion from low voltage-swing RWD bus to the high-voltage FIFO to use the low-voltage signally concept. This voltage level conversion, however, requires additional logic which reduces the speed, and increases the design space of, the FIFO 10.

As is also known in the art, dynamic logic circuits are becoming used in applications requiring speeds greater than that obtainable with CMOS type (i.e., static) logic, such as that described above in connection with FIG. 1. Unlike static logic, dynamic logic circuits store data as charge. Thus, in order to operate properly, a node of the dynamic logic circuit must be pre-charged prior to responding to the logic state of an input signal to the dynamic logic circuit.

SUMMARY OF THE INVENTION

In accordance with the invention, a circuit is provided having: a storage circuit adapted to store data after such circuit has been placed in a set condition; an output circuit responsive to an output strobe pulse for coupling the stored data to an output; and, a reset circuit for resetting the storage circuit in response to a trailing edge of the output strobe pulse.

With such an arrangement, a low voltage bus signalling architecture is provided which enables incorporation of a bus driver having only NMOS transistors and a dynamic logic circuit.

In accordance with another embodiment, a circuit is provided having a charging circuit for placing an initial charge on a node. The circuit includes a data transfer circuit, responsive to an input data and the input strobe pulse, for transferring the input data to the node. Also provided is an output circuit, responsive to an output strobe pulse, for coupling the data at the node to an output and for charging the node in response to the output strobe pulse.

In one embodiment, the output circuit initiates coupling of the data at the node to the output in response to a leading edge of the output strobe pulse and couples charge to the node in response to a trailing edge of the output strobe pulse.

In accordance with yet another embodiment of the invention, a circuit is provided having a charging circuit for placing an initial charge on a node. A data transfer circuit is included. The data transfer circuit is responsive to an input data and the input strobe pulse, for transferring the input data to the node. A latch is provided for storing data at the node. An output circuit is responsive to an output strobe pulse for coupling the latched data to an output and for charging the node in response to the output strobe pulse.

In one embodiment, the output circuit initiates coupling of the latched data to the output in response to a leading edge of the output strobe pulse and couples charge to the node in response to a trailing edge of the output strobe pulse.

In accordance with another embodiment of the invention, a circuit is provided having a charging circuit, comprising a first transistor having a first source/drain electrode adapted for coupling to a voltage supply and a second source/drain electrode connected to a node. The charging circuit couples the voltage supply to the node to place an initial charge on the node. A data transfer circuit is provided comprising a second transistor having a gate adapted for coupling to an input strobe pulse, a first source/drain electrode connected to the node, and a second source/drain electrode responsive to an input data and the input strobe pulse, for transferring the input data to the node. An output circuit is responsive to an output strobe pulse for coupling the data at the node to an output and for charging the node in response to the output strobe pulse.

In one embodiment, the output circuit initiates coupling of the data at the node to the output in response to a leading edge of the output strobe pulse and couples charge to the node in response to a trailing edge of the output strobe pulse.

In one embodiment, the output circuit produces a pulse to a gate of the first transistor in response to the trailing edge of the output strobe pulse.

BRIEF DESCRIPTION OF THE DRAWING

These and other features of the invention will become more readily apparent from the following detailed description when read together with the accompanying drawings,m in which:

FIGS. 4A–4G are timing diagrams useful in understanding the operation of the architecture of FIG. 3.

DESCRIPTION OF THE PREFERRED EMBODIMENT

Figure 3:
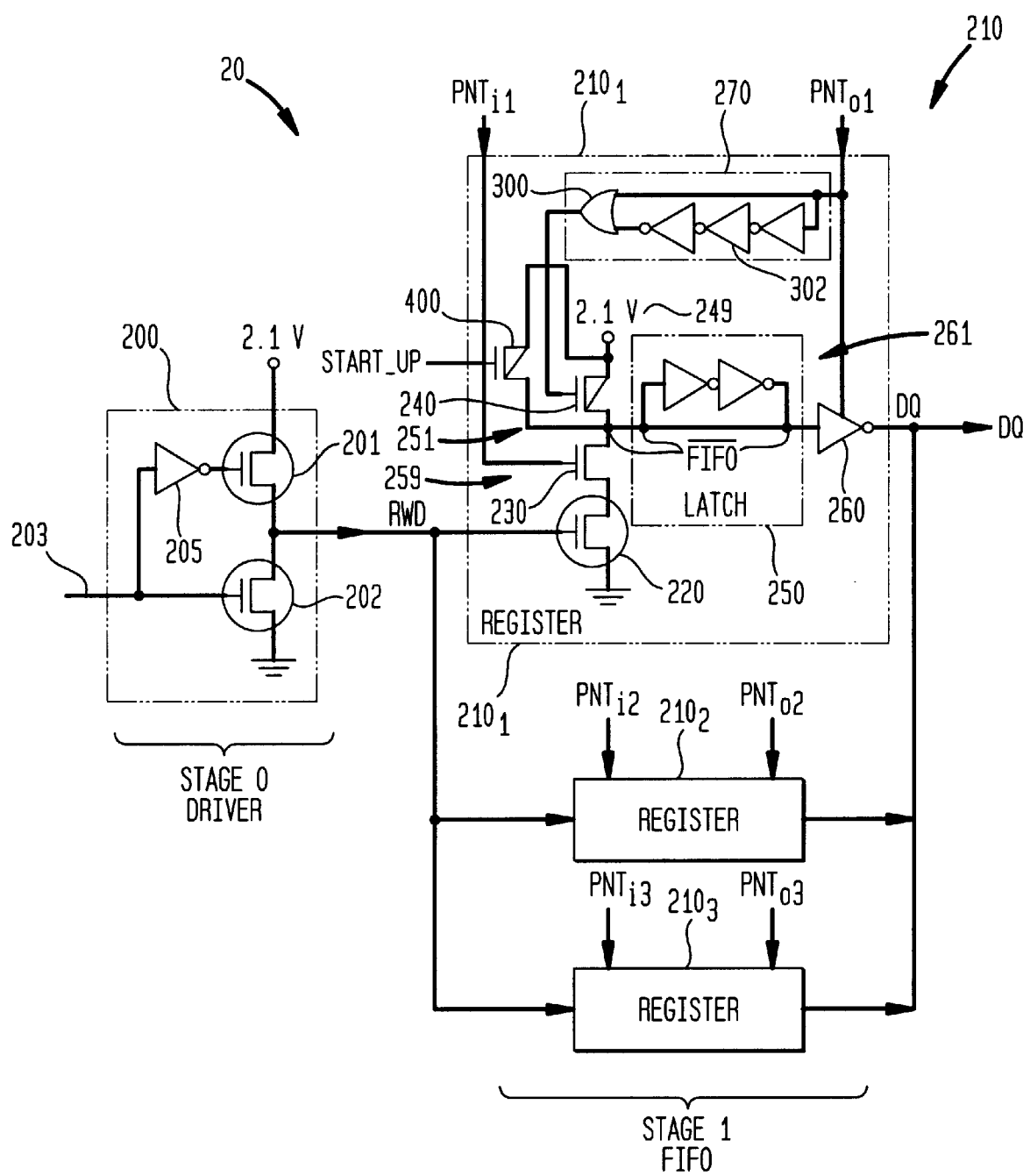
FIG. 3 is a block diagram of an architecture having an NMOS bus driver and dynamic logic FIFO registers according to the invention.

Referring now to FIG. 3, a low voltage signally architecture 20 having an NMOS bus driver and dynamic logic FIFO registers is shown to include: a driver 200, here an all n-channel MOSFET (i.e., NMOS transistor) inverter, fed by an input logic signal on line 203 (here a low voltage bus RWD); and, a storage section 210 (i.e., FIFO registers). As will be described in detail hereinafter, the storage section 210 includes: a storage circuit, e.g., latch 250 adapted to store data after such section 210 has been placed in a set condition; and, an output circuit 260 responsive to an output strobe pulse PNTo1 for coupling the stored data to an output DQ and a reset circuit 270 for pre-charging the storage circuit 210 through PMOS transistor 240 in response to a trailing edge of the output strobe pulse PNTo1.

Figure 1:
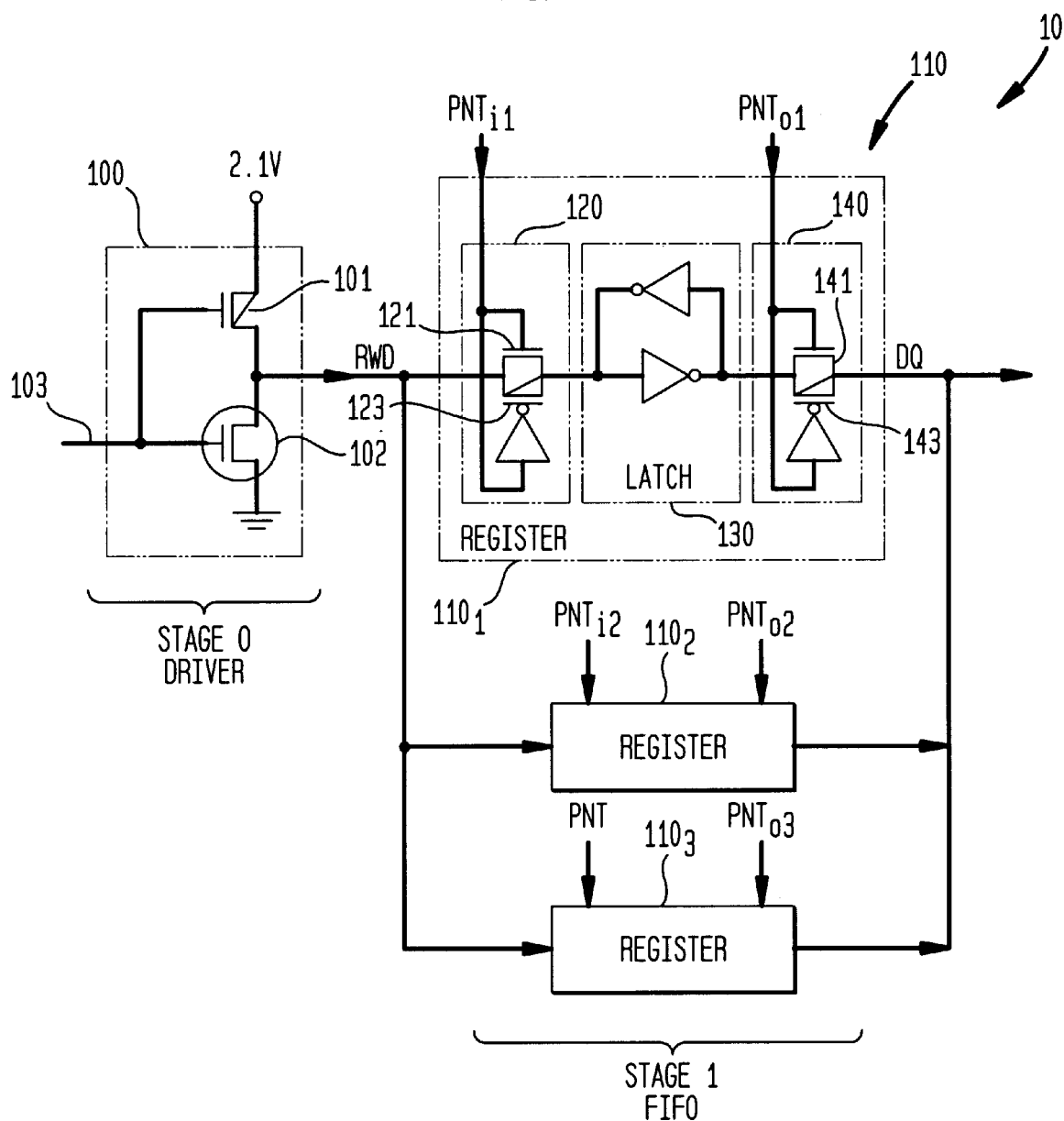
FIG. 1 is a block diagram of a low voltage signalling architecture having a CMOS bus driver and CMOS FIFO registers according to the PRIOR ART.
Figure 2:
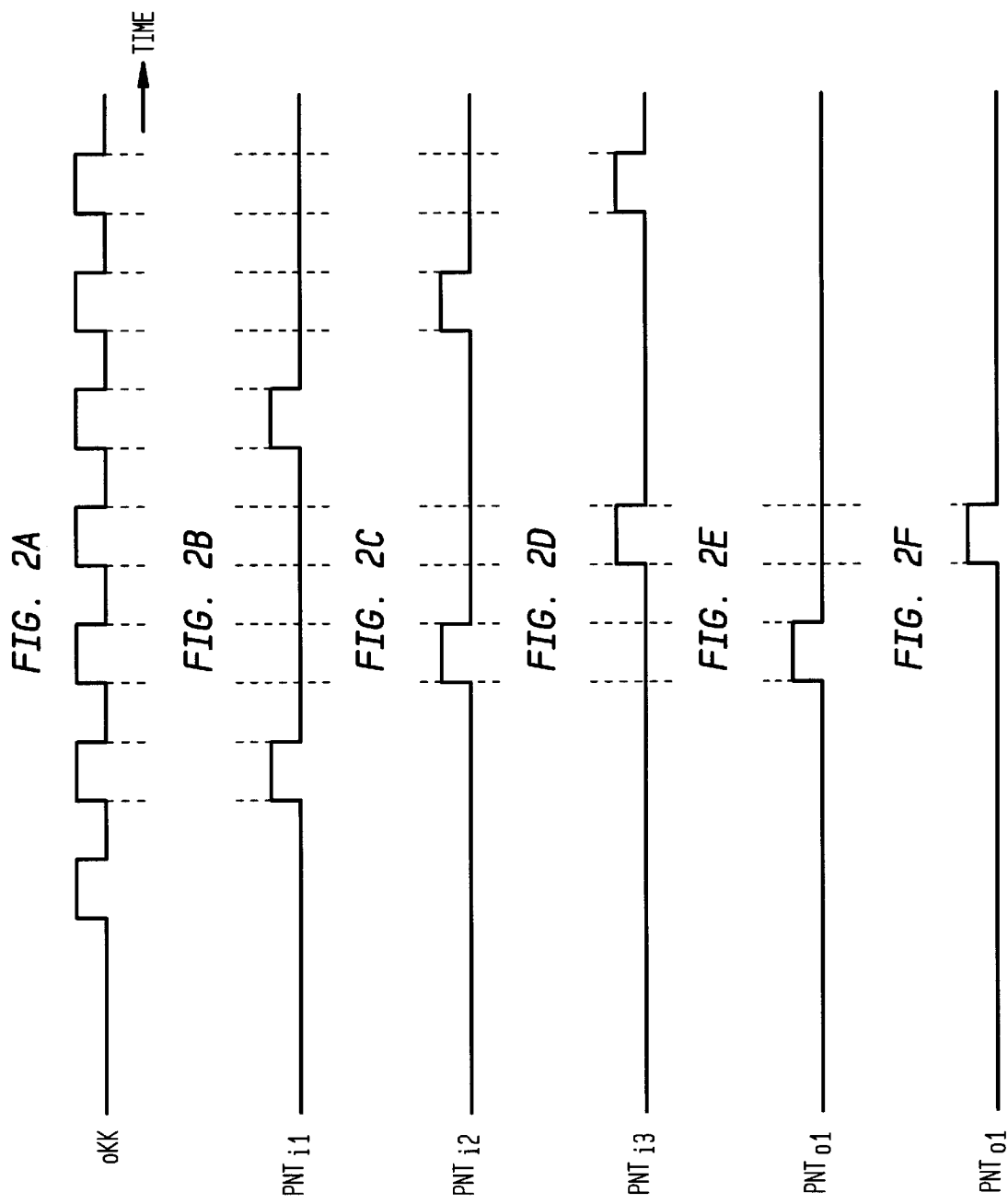
FIGS. 2A–2F are timing diagrams useful in understanding the architecture of FIG. 1.

More particularly, the inverter, here a low voltage driver 200, here has a pair of n-channel MOS transistors 201, 202 arranged as shown. More particularly, transistor 201 is a low threshold n-channel MOSFET having its source connected to a +1 supply, its gate connected to a logic input signal fed to line 203 through an inverter 205, and a drain connected to the source of n-channel MOSFET 202, also a low threshold transistor. The gate of MOSFET 202 is also connected to line 203, the drain of MOSFET 202 being connected to a reference potential, here ground. The logic input signal fed to line 203 varies between ground (i.e., a logic 0, here "low") and +2.1 volts (i.e., a logic 1, here "high" for high speed logic operation. On the other hand, the NMOS pull-up device 201 in the low voltage bus driver 200 of FIG. 3 uses +1 supply, unlike a conventional PMOS pull-up device 101, FIG. 1, which used a CMOS voltage bus driver 100 and a +2.1 volt supply). The transistor 201 and 202 have a low threshold level, here 0.2 volts, for high speed operation. Thus, when the logic input signal is logic 0, the output of the inverter (i.e., a read-write-drive (RWD) bus) becomes +1 s and, on the other hand, when the input logic signal is logic 1, the bus RWD becomes 0 volts. Note that using low level NMOS transistors 201 and 202 is an important feature and is possible because the RWD bus swing is small, such as from 0 to 1 volt. Otherwise, there may be leakage current from the source (i.e., 2.1 volts) to ground (0 volts) constantly because of a short-channel effect of the NMOS transistors.

Referring in more detail to the storage section 210, such section 210 includes a plurality of, here 3, parallel storage units or registers, $210_1$–$210_3$, as indicated. Each one of the storage registers, $210_1$–$210_3$ is identical in construction, an exemplary one thereof, here register $210_1$, being shown in detail. Each one of the registers $210_1$–$210_3$ is fed by a pair of strobe pulses on lines. PNTi1, PNTo1; PNTi2, PNTo2; and PNTi3, PNTo3, respectively, as indicated. The lines PNTi1, PNTi2, and PNTi3, are referred to as pointer input lines. The lines PNTo1, PNTo2, and PNTo3, are referred to as pointer output lines.

Thus, considering exemplary register $210_1$, such register $210_1$, includes a charging circuit 251, comprising a first transistor 240, here a p-channel MOSFET having: a first source/drain electrode adapted for coupling to a voltage supply, here a +2.1 volt supply 249; and a second source/drain electrode connected to a nodeFIFO . The charging circuit 251 couples the +2.1 volt supply 249 to the nodeFIFO to place an initial charge on the nodeFIFO. The FIFO register 210 can therefore convert the low voltage input swing on the RWD (i.e., 0 to 1 volts) to CMOS voltage level swing at nodeFIFO (i.e., 0 to 2.1 volts).

A data transfer circuit 259 comprises a second transistor 230 having a gate adapted for coupling to an input strobe pulse PNTi$_1$, a first source/drain electrode connected to the nodeFIFO, and a second source/drain electrode responsive to an input data on bus RWD and the input strobe pulse PNTi1, for transferring the low voltage swing (0 to 1 volt) input data on bus RWD to the nodeFIFO. The nodeFIFO is pre-charged at a high voltage level which has been enabled soon after the previous data output operation from the nodeFIFO to line DQ. The logic state represented by the charge, or lack of charge, at nodeFIFO in response to an input strobe PNTi1, subsequent to the charging of the nodeFIFO, is stored, or latched, into latch 250. Thus, the latch 250 stores the data (i.e., logic state) at the nodeFIFO.

More particularly, the data transfer circuit 259 includes, in addition to the second transistor 230, a third transistor 220. The transistor 230 is an n-channel MOSFET having a high threshold level, here 0.6 volts, and transistor 220 is also an n-channel MOSFET having a low threshold level, here 0.2 volts. The gate of transistor 220 is coupled to the RWD bus, one of the source/drains is connected to a reference potential, here ground, and the outer one of the source/drain electrodes is connected to one of the source/drains of transistor 230, as shown. The gate of transistor 230 is coupled to the input strobe pulse PNTi1, as described above. The high threshold level of transistor 230 is used to prevent leakage from the nodeFIFO to ground and the low threshold level of transistor 220 is for compatibility with the 0 to 1 volt swing on bus RWD. Thus, it is noted that different voltage swings are on bus RWD and the lines PNTi$_1$ and PNTo$_1$; the former being a swing of 0 to 1 volts and the latter being from 0 to 2.1 volts.

The reset circuit 270 controls the pre-charge PMOS transistor 240 to initialize the nodeFIFO. The nodeFIFO is latched by the latch circuit 250. The output strobe pulse PNTo$_1$, is coupled to both the reset circuit 270 (i.e., a trailing edge detector) and output circuit 260. When the output strobe pulse PNTo$_1$ goes "high" (i.e., logic 1), the output circuit 260, a gated inverter, is enabled. The enabled inverter 260 allows the inverted logic state at nodeFIFO to be driven to output line DQ. The output circuit 260 drives the output line DQ until the strobe pulse PNTo1 goes "low" (i.e., logic 0).

The reset circuit 270, here a trailing edge detector, produce a logic "low" (i.e., logic 0in response to the trailing edge of the output strobe pulse PNTo1. The trailing edge detection circuit 270 includes an OR gate 300 having one input fed by the output of the inverter 272 and an odd number of serially connected inverters 302. The three inverters 302 are selected to provide a delay to the output strobe pulse PNTo1 to generate a small pulse to be described in connection with FIGS. 4A–4G, note particularly FIG. 4G). The pulse (FIG. 4G) has a width adjusted to pre-charge the nodeFIFO sufficiently, which is typically about 2 nanoseconds. In this way, the OR gate 300 will change from a logic 0 to a logic 1 in response to the trailing edge of the output strobe pulse PNTo1. The output of the OR gate 300 is fed to the gate of transistor 240. Thus, as will be described, the transistor 240 is turned on in response to the trailing edge of the output strobe pulse PNTo1 and thereby couple the voltage supply 249 to the nodeFIFO to supply charge (i.e, re-initialize, or reset) the nodeFIFO after the data stored in the latch 250 has passed to line DQ.

More particularly, the reset circuit 270 is responsive to the output strobe pulse PNTo1, for charging to the nodeFIFO (i.e., for resetting, or re-initializing, the nodeFIFO ) in response to the output strobe pulse PNTo1. The reset circuit 270 is enabled soon after the latched data on nodeFIFO is transferred to output DQ by the output strobe pulse PNTo$_1$, as described above. More particularly, the reset circuit 270 initiates coupling of the latched data at the nodeFIFO to the output DQ in response to a leading edge of the output strobe pulse PNTo1 and couples charge (i.e., reset, or re-charges) to the nodeFI FO in response to a trailing edge of the output strobe pulse PNTo1. It should be noted that the low voltage signalling on bus RWD (i.e., 0 to 1 volts) is converted by this self-resetting FIFO 210 to a higher swing (i.e., 0 to +2.1 volts).

Referring to FIGS. 4A through 4G, an example is shown which illustrates the operation of the section 210. Thus, initially it is assumed that the nodeFIFO is charged by charge passing from +2.1 volt supply 249 through PMOS transistor 240 to such nodeFIFO, as indicated in FIG. 4C. It is noted that initially the output of reset circuit 270 is high (i.e., logic 1) as shown in FIG. 4G unless the PNTo$_1$transition from "high" to "low" is detected. The nodeFIFO is pre-charged and latched at a high level, here +2.1 volts, after the previous cycle has been finished. Assume, in this example, that at time t$_1$, the state of line RWD is one volt or logic 1, as shown in FIG. 4A. Further, at time t$_1$, an input strobe pulse PNTi1 is produced, as shown in FIG. 4B. Thus, transistors 230 and 220 will conduct driving nodeFIFO to "low" (i.e., to ground), as shown in FIG. 4C by the arrow 500. Assume, in this example, that an output strobe pulse PNTo1 is produced at time t$_2$, as shown in FIG. 4D. In response to such output strobe pulse PNTo1, the output line DQ has fed to it the output of latch 250, here the inverted logic state stored in nodeFIFO by latch 250 (i.e., a "high"or logic 1), as indicated in FIG. 4E. It is noted that the latch data is passed to line DQ in response to the leading edge 501 of the output strobe pulse PNTo1, as indicated by the arrow 502 in FIGS. 4D and 4E.

Referring to FIG. 4D, the time history of the output strobe pulse PNTo1 is shown (i.e., such output strobe pulse PNTo$_1$ also being one of the two inputs to OR gate 300, FIG. 3). The output of the three inverters 302 (FIG. 3), i.e., the second input to OR gate 300, is shown in FIG. 4F. The output of the OR gate 300 (i.e., the output of the reset, or trailing edge detector 270) is shown in FIG. 4G. It is noted that in response to the trailing edge 504 of the output strobe pulse PNTo1, the trailing edge detector 270 is a pulse which goes to a logic 1 state (i.e., high) at time t$_3$ in response to the trailing edge 504 of the output strobe pulse PNTo1. The pulse produced by the trailing edge detection circuit 270 (FIG. 4G) resets the section 210. That is, in response to the trailing edge 504 of the output strobe pulse PNTo1, the trailing edge detection circuit 270 turns transistor 240 "on" to thereby couple the +2.1 volt supply 249 to nodeFIFO and thereby again place an initialization charge on such nodeFIFO for the subsequent PNTo$_1$, cycle. Although the pulse is soon disabled, the produced nodeFIFO maintains 2.1 volts because of latch 250.

Considering the case when the logic state on bus RWD is "low" or a logic 0, as at time t$_4$ when the input strobe pulse PNTi1 goes high. Because the signal on bus RWD is "low" at time t$_3$, the charge remains on nodeFIFO, as indicated in FIG. 4C. In response to the leading edge 501' of the output strobe pulse PNTo1 at time t$_5$ (FIG. 4D), the logic 1 stored in latch 250 passes, inverted, to line DQ, as shown in FIGS. 4D and 4E at time t$_5$, as indicated by arrow 502'. In response to the trailing edge 504' of the output strobe pulse PNTo1 (FIG. 4D), the charge on nodeFIFO remains or, if decayed, becomes rejuvenated (i.e., re-charged) when the output of trailing edge detector 270 goes "high" (FIG. 4G) at time $t_6$ to turn "on" transistor 240 (FIG. 3).

It is noted that prior to normal operation, in order to initialize nodeFIFO, a logic 0 (i.e., "low") pulse is applied to the gate of p-channel MOSFET 400 (i.e., line START_UP) to turn such transistor 400 "on" for a time to charge nodeFIFO through the power supply 249.

Other embodiments are within the spirit and scope of the appended claims. For example, the self-reset operation may be applied to circuits other than FIFO circuits. Thus, the self-reset operation may be applied to other circuits, chips, systems, or even software.

What is claimed is:

1. A circuit, comprising:
    a charging circuit, responsive to an output strobe pulse, for placing an initial charge on a node;
    a data transfer circuit, responsive to an input data and an input strobe pulse, for transferring the input data to the node;
    an output circuit, responsive to the output strobe pulse for coupling the data at the node to an output and for charging the node in response to the output strobe pulse.

2. The circuit recited in claim 1 wherein the output circuit initiates coupling of the data at the node to the output in response to a leading edge of the output strobe pulse and couples charge to the node in response to a trailing edge of the output strobe pulse.

3. A circuit, comprising:
    a charging circuit, responsive to an output strobe pulse, for placing an initial charge on a node;
    a data transfer circuit, responsive to an input data and an input strobe pulse, for transferring the input data to the node;
    a latch for storing data at the node;
    an output and reset circuit, responsive to the output strobe pulse for coupling the latched data to an output and for charging the node in response to the output strobe pulse.

4. The circuit recited in claim 3 wherein the output and reset circuit initiates coupling of the latched data to the output in response to a leading edge of the output strobe pulse and couples charge to the node in response to a trailing edge of the output strobe pulse.

5. A circuit, comprising:
    a charging circuit, comprising a first transistor having a first source/drain electrode for coupling to a voltage supply and a second source/drain electrode connected to a node, such charging circuit coupling the voltage supply to the node to place an initial charge on the node;
    a data transfer circuit, comprising a second transistor having a gate adapted for coupling to an input strobe pulse, a first source/drain electrode connected to the node, and a second source/drain electrode responsive to an input data, for transferring the input data to the node;
    an output and reset circuit, responsive to an output strobe pulse for coupling the data at the node to an output and for charging the node in response to the output strobe pulse.

6. The circuit recited in claim 5 wherein the output and reset circuit initiates coupling of the data at the node to the output in response to a leading edge of the output strobe pulse and couples charge to the node in response to a trailing edge of the output strobe pulse.

7. The circuit recited in claim 6 wherein the output and reset circuit includes a trailing edge detector for detecting the trailing edge of the output strobe pulse and wherein such trailing edge detector produces a signal to the gate of the first transistor in response to such detected trailing edge.

8. A circuit, comprising:
    a charging circuit, comprising a first transistor having a first source/drain electrode adapted for coupling to a voltage supply and a second source/drain electrode connected to a node, such charging circuit coupling the voltage supply to the node to place an initial charge on the node;
    a data transfer circuit, comprising a second transistor having a gate for coupling to an input strobe pulse, a first source/drain electrode connected to the node, and a second source/drain electrode responsive to an input data, for transferring the input data to the node;
    a latch for storing data at the node; and
    an output and reset circuit, responsive to an output strobe pulse for coupling the stored to an output and for charging the node in response to the output strobe pulse.

9. The circuit recited in claim 8 wherein the output and reset circuit initiates coupling of the stored data at the node to the output in response to a leading edge of the output strobe pulse and couples charge to the node in response to a trailing edge of the output strobe pulse.

10. The circuit recited in claim 9 wherein the output and reset circuit includes a trailing edge detector for detecting the trailing edge of the output strobe pulse and wherein such trailing edge detector produces a signal to the gate of the first transistor in response to such detected trailing edge.

11. A circuit, comprising:
    a charging circuit, comprising a first transistor having a first source/drain electrode for coupling to a voltage supply and a second source/drain electrode connected to a node, such charging circuit coupling the voltage supply to the node to place an initial charge on the node;
    a data transfer circuit, comprising a second transistor having a gate adapted for coupling to an input strobe pulse, a first source/drain electrode connected to the node, and a second source/drain electrode responsive to an input data, for transferring the input data to the node;
    an output and reset circuit, comprising a delay circuit responsive to the output strobe pulse for charging the node in response to the output strobe pulse, and for coupling the data at the node to an output in response to such output strobe.

12. circuit recited in claim 11 wherein the output and reset circuit initiates coupling of the data at the node to the output in response to a leading edge of the output strobe pulse and couples charge to the node in response to a trailing edge of the output strobe pulse.

13. circuit recited in claim 12 including a trailing edge detector for detecting the trailing edge of the output strobe pulse and wherein such trailing edge detector produces a signal to the gate of the first transistor in response to such detected trailing edge.

14. A circuit, comprising:
    a charging circuit, comprising a first transistor having a first source/drain electrode adapted for coupling to a voltage supply and a second source/drain electrode connected to a node, such charging circuit coupling the voltage supply to the node to place an initial charge on the node;

a data transfer circuit, comprising a second transistor having a gate for coupling to an input strobe pulse, a first source/drain electrode connected to the node, and a second source/drain electrode responsive to an input data, for transferring the input data to the node;

a latch for storing the data at the node;

an output circuit, comprising a delay circuit responsive to the output strobe pulse for coupling charge to the node in response to the output strobe pulse, and for coupling the latched data to an output in response to such output strobe.

15. The circuit recited in claim 14 wherein the output circuit initiates coupling of the latched data at the node to the output in response to a leading edge of the output strobe pulse and couples charge to the node in response to a trailing edge of the output strobe pulse.

16. The circuit recited in claim 15 wherein the output circuit includes a trailing edge detector for detecting the trailing edge of the output strobe pulse and wherein such trailing edge detector produces a signal to the gate of the first transistor in response to such detected trailing edge.

17. A system, comprising:

a driver fed by an input logic signal for producing an output logic signal, such output logic signal having a relative low voltage swing; and a storage register having dynamic logic responsive to a pre-charge strobe pulse for storing charge at a node representing the output logic signal and responsive to a reset strobe for transferring the stored charge to an output and for re-setting the charge at the node, such pre-charge strobe pulse having a relatively large voltage swing for storing the output logic signal in response to such strobe pulse.

18. A system, comprising:

a driver fed by an input logic signal for producing an output logic signal, such output logic signal having a first voltage swing; and a storage register having dynamic logic, such register being responsive to a strobe pulse having a second voltage swing for storing the output logic signal in response to such strobe pulse; and wherein the storage register includes a charge storing node and wherein the charge storing node is coupled to a reference potential serially through a pair of transistors, one of such transistors being connected to the node and having a gate for coupling to the strobe pulse and the other one of the transistors being coupled between the first transistor and the reference potential, such second transistor having a gate fed by the driver output logic signal.

19. The system recited in claim 18 wherein the pair of transistors are NMOS transistors.

20. The system recited in claim 18 wherein the first transistor has a relatively high threshold level and the second transistor has a relatively low threshold level.

21. The system recited in claim 20 wherein the driver includes an NMOS transistor for providing the output logic signal fed to the gate of the second transistor of the storage register.

22. The system recited in claim 21 wherein the storage register is a FIFO storage register.

23. The system recited in claim 18 wherein the first voltage swing is a relative low voltage swing and the second voltage swing is a relative high voltage swing.

* * * * *